United States Patent [19]

Takeda et al.

[11] 4,050,936
[45] Sept. 27, 1977

[54] IMAGE FORMING PROCESS WITH PHOTOPOLYMER LAYERS BETWEEN A SUPPORT AND A SUBSTRATE

[75] Inventors: Keiji Takeda; Masataka Murata; Teppei Ikeda, all of Minami-Ashigara, Japan

[73] Assignee: Fuji Photo Film Co., Ltd., Minami-ashigara, Japan

[21] Appl. No.: 645,148

[22] Filed: Dec. 29, 1975

[30] Foreign Application Priority Data

Dec. 28, 1974 Japan .................................... 50-300

[51] Int. Cl.$^2$ ...................... G03C 11/12; G03C 5/00
[52] U.S. Cl. ........................................ 96/28; 96/35.1; 96/68
[58] Field of Search ............................. 96/35.1, 28, 68

[56] References Cited

U.S. PATENT DOCUMENTS

| | | | |
|---|---|---|---|
| 3,060,026 | 10/1962 | Heiart | 96/28 |
| 3,157,505 | 11/1964 | Notley | 96/68 |
| 3,240,600 | 3/1966 | Abbot | 96/28 |
| 3,244,519 | 4/1966 | Schwerin | 96/28 |
| 3,573,918 | 4/1971 | Chambers | 96/28 X |
| 3,615,435 | 10/1971 | Chu et al. | 96/28 |
| 3,660,088 | 5/1972 | Landsager | 96/28 X |
| 3,754,920 | 8/1973 | Kuchta | 96/28 X |
| 3,770,438 | 11/1973 | Celeste | 96/28 X |
| 3,785,817 | 1/1974 | Kuchta | 96/28 |
| 3,891,441 | 6/1975 | Tsuji et al. | 96/68 |
| 3,898,086 | 8/1975 | Franer | 96/28 |
| 4,002,478 | 1/1977 | Kokawa et al. | 96/68 X |

Primary Examiner—Edward C. Kimlin
Attorney, Agent, or Firm—Sughrue, Rothwell, Mion, Zinn and Macpeak

[57] ABSTRACT

An image forming process which comprises image-wise exposing a photosensitive material to light, the photosensitive material comprising a support and a substrate with a photopolymerizable material therebetween, and stripping off the support to leave either exposed areas or non-exposed areas of the photopolymerizable material on the substrate, in which the photopolymerizable material is characterized by comprising at least two different photopolymerizable layers which each comprise one or more addition polymerizable monomers, one or more photopolymerization initiators and one or more binders, which photopolymerizable layers are placed adjacent the support and the substrate, wherein at least one of the ingredients or the ratio of the ingredients of the photopolymerizable layers is different in at least the two different photopolymerizable layers, and the photopolymerizable layers have the relationship of $C>A>B$ and $C'>B'>A'$ or $C>B>A$ and $C'>A'>B'$, wherein:

A is the adhesive strength between the support and the photopolymerizable layer adjacent thereto;

B is the adhesive strength between the substrate and the photopolymerizable layer adjacent thereto;

C is the lowest adhesive strength of all the adhesive strengthes between any two photopolymerizable layers among the layers, A' is the adhesive strength between the support and the photopolymerizable layer adjacent thereto after exposure to light, B' is the adhesive strength between the substrate and the photopolymerizable layer adjacent thereto after exposure to light, and C' is the lowest adhesive strength of all the adhesive strengths between any two photopolymerizable layers among the photopolymerizable layers after exposure to light.

25 Claims, 1 Drawing Figure

IMAGE FORMING PROCESS WITH PHOTOPOLYMER LAYERS BETWEEN A SUPPORT AND A SUBSTRATE

BACKGROUND OF THE INVENTION

1. Field of the Invention

The present invention relates to an image forming process, particularly, to a dry process for recording images using a photopolymerizable material.

2. Description of the Prior Art

Hitherto, as photoresist materials used for producing printed circuits, recording materials which are subjected to solution development, using, for example, a photosensitive solution comprising a bichromate and glue or polyvinyl alcohol, a photosensitive solution comprising polyvinyl cinnamate and a photosensitizing agent, or a photosensitive solution comprising natural rubber or cyclized rubber and a cross linking agent as main ingredients have been widely used. Further, there are known photoresist materials which comprise a photosensitive material inserted between two plastic films. In such photoresist materials, one of the plastic films is stripped off to expose the photosensitive material upon use. After being superposed on a desired substrate for a printed circuit, the photosensitive layer is image-wise exposed to light through the remaining plastic film, whereafter the plastic film is removed and the photosensitive layer is developed by a suitable developer such as an organic solvent or an aqueous alkali solution, etc. The photosensitive layer hardened by exposure to light remains on the printed circuit substrate while non-exposed portions are removed by dissolution in a developer to form a resist pattern for a printed circuit. However, processing solution development type recording materials is complicated because a developing solution must be used. Further, waste developer liquids pose a serious danger of environmental pollution.

Recently, dry development image recording material and processes have been suggested, e.g., as described in Japanese Patent Publications 9663/63 and 22901/68, Japanese Patent Publication (OPI) 7728/72, Japanese Patent Publication 43126/73 and Japanese Patent Publication (OPI) 33623/72, there are processes for forming images utilizing the property that the order of the adhesive strength of a resist layer in exposed areas to the support and to the printed circuit substrate is the reverse of that of the resist layer in non-exposed areas. This process generally comprises applying a photopolymerizable composition (photosensitive layer) consisting of an addition polymerizable monomer, a light polymerization initiator and a binder to a support, such as a thin transparent plastic film, contacting the photosensitive layer with a transparent or opaque substrate such as a metal plate, a plastic plate or film, or paper, etc., image-wise exposing to light through the transparent support using an original and stripping off the support to leave either the exposed portions or the non-exposed portions of the photosensitive layer on the PC substrate or the support, whereby negative images and positive images are formed on the substrate and the support. According to this recording process, images such as a resist pattern can be formed merely by stripping off the support because liquid development is unnecessary. Accordingly, the production process per se of printed circuits is rendered more economical. Further, there is no danger of environmental pollution, as waste liquids are not discharged.

In the production of resist patterns on printed circuit substrates, in some cases the whole portion of the resist pattern is closely adhered to a substrate, such as a copper plate, superposed on a plastic plate. On the other hand, in the case of producing printed circuits using a substrate having through-holes wherein both surfaces of the substrate and the inside faces of the through-holes are covered with a metal layer by which the circuits formed on both surfaces of the substrate are in electrical communication via the inside faces of the through-holes, it is necessary to form a resist film over the through-holes without contact between the resist film and the entire metal surface (called tenting). Tenting is necessary to prevent etching of the metal layer on the inside faces of the through-holes when printed circuits are formed by etching. In the case of tenting, it is required that the formed resist film adhere closely to the substrate at only very small areas around the through-holes while other portions of the resist film be supported by the cohesive force of the film over the through-holes and such a film have a strength sufficient to withstand the mechanical shock due to the spraying pressure of a spray type etching process. Accordingly, the properties of materials for forming a resist film, particularly properties such as the film strength of the polymer film used as a binder, are important.

In stripping development recording materials suggested hitherto, polymers such as chlorinated polyolefins (see Japanese Patent Application 97049/73) or chlorinated rubber (see Japanese Patent Publication (OPI) 7728/72) have been exclusively used as the binder for obtaining images of excellent quality. Although the resist film using such polymers has a sufficient antietching capability in the case that the total film is closely adhered to the base plate, it does not have a film strength sufficient to withstand a spraying pressure at etching in the case of use for tenting, and, consequently, the tented resist film laid over the through-holes of the substrate is broken during etching.

Properties required of a resist film are described in Japanese Patent Application 97049/73, that is, the adhesive strength between the resist layer which remains on the substrate and the substrate must be sufficiently high at stripping development so that the resist layer is not stripped off due to the resist layer to be removed. On the other hand, it is further necessary that the adhesive strength between the resist layer which remains and the support to be removed be low. Further, it is preferred that the resist layer be sharply broken at boundary lines between exposed areas and non-exposed areas, whereby sharp resist images are formed on the substrate. According to the result of studies, we have found that a resist layer which forms such sharp images often has the fault that tenting film strength is low, and the resist film on the through-hole portions is broken during etching.

SUMMARY OF THE INVENTION

One object of the present invention is to provide a novel process for forming resist patterns having good image quality, good film strength, and, particularly, a film strength sufficient for tenting, which comprises using a stripping development photosensitive material.

In particular, the present invention provides a process which involves image-wise exposing a photopolymerizable element comprising a support, a substrate and a photopolymerizable material therebetween. The photopolymerizable material comprises plurality of sublayers. The sublayers which are adjacent to the support or the substrate primarily contribute to provide images of good quality by sharply breaking at the interphase between exposed and unexposed areas upon stripping development. On the other hand, sublayers intermediate these two sublayers (sublayers which are not adjacent the support or the substrate) do not contribute directly to image quality, rather, they primarily contribute to providing a resist film (after exposure and stripping development) which is mechanically strong.

Thus, both good image quality (sharp breaking upon stripping development) and good mechanical strength in the resultant resist image are achieved utilizing the photopolymerizable elements of the present invention wherein a binder which provides clear images is used in sublayers adjacent the support and the substrate and a binder which provides good resist strength is used in the intermediate layer(s).

It should thus be clear to one skilled in the art that the binder(s) used in the sublayers adjacent the support or substrate should not have a high breaking point on their shear-strain curve, rather, must have the property that the adhesion gradient of the binder-monomer combination to the support and the substrate is reversed between exposed and unexposed areas.

It is one object of the present invention to improve the above described faults of the prior art. As a result of many studies, we have found that excellent images sharpness can be obtained where the resist layer which is adjacent the support or the resist layer which is adjacent the substrate is sharply broken in correspondence to the image-wise exposure, even though resist layers therebetween have a high film strength such that tenting films are not broken by sprayed etching solution. Accordingly, this invention provides a multilayer structure which forms sharp resist images and has a high tenting strength, wherein the multilayer structure comprises at least one resist layer which is adjacent the support or one resist layer which is adjacent the substrate which forms sharp images which need not form a tenting film resistant to etching processing, and at least one resist layer having a high film strength which is adjacent to said resist layer. The resist layer can be considered to have "high film strength" if, after photopolymerization, the strength of the layer is sufficient to resist the pressure of etchant during etching spraying. On the other hand, the resist layer which is to form sharp images essentially splits away from the substrate leaving exposed portions which have sharply defined vertical planes (if the edges of the exposed portions gradually taper to the substrate such is considered an "unclear" image).

The present invention also relates to a process for forming patterns using a photosensitive material having two or more photosensitive layers which differs from prior art stripping development photosensitive materials which have only one sensitive layer.

Figure 1:
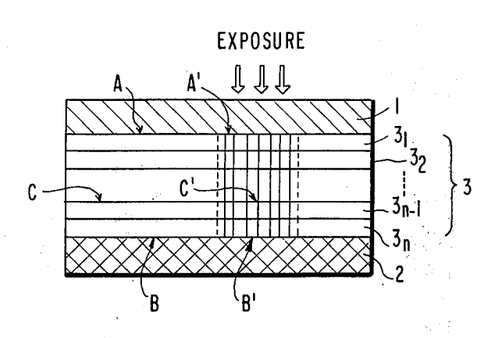
The FIGURE shows a section view of a photosensitive material used in the present invention.

The process of the present invention comprises image-wise exposing the photosensitive material to light, stripping a support to form an image of a light hardened layer adhered to a substrate and removing, at the same time, non-exposed photosensitive layer from the substrate while adhered to the support, wherein the photosensitive material is characterized by comprising at least two photosensitve layers, preferably two or three photosensitive layers, composed of one or more addition polymerizable monomers, one or more light polymerizaton initiators and one or more binders (in the attached FIGURE the photosensitive layers 3 are shown as $3_1, \ldots 3_n$ (where $n$ is an integer of 2 or more)) are placed adjacent one another between a transparent support and a substrate, the photosensitive layers each being composed of different ingredients or each having a different ratio of ingredients, wherein the photosensitive layers are superposed on the substrate so as to have the following relationship: $C>A>B$ and $C'>B'>A'$ or $C>B>A$ and $C'>A'>B'$, preferably $C'>C>B'>A>B>A'$ in the former case and $C'>C>A'>B>A>B'$ in the latter case, wherein A is the adhesive strength between the transparent support and the light-sensitive layer assembly at non-exposed areas, namely where addition polymerizable monomer(s) remains in the photosensitive layers without reaction, B is the adhesive strength between the substrate and the light-sensitive layer assembly at non-exposed areas, C is the adhesive strength between each individual layer $3_1, 3_2, \ldots 3_n$ in the light-sensitive layer assembly (in more detail, C is the lowest adhesive strength of all interface adhesive strengthes between each layer $3_1, 3_2, \ldots 3_n$ in the case where the light-sensitive layer assembly comprises three or more layers), A' is the adhesive strength between the transparent support and the light-sensitive layer assembly at exposed areas, namely, hardened areas where addition polymerizable monomer(s) hardly remains in the photosensitive layers, B' is the adhesive strength between the substrate and the light-sensitive layer assembly at exposed areas and C' is the adhesive strength between each layer $3_1, 3_2, \ldots 3_n$ comprising the light-sensitive layer assembly at exposed areas(in more detail, the lowest adhesive strength of all interface adhesive strengths between each layer in the case that the light-sensitive layer assembly is composed of three or more layers).

DETAILED DESCRIPTION OF PREFERRED EMBODIMENTS

In each layer of the photosensitive element, namely the layers shown as $3_1, 3_2, \ldots 3_{n-1}$, and $3_n$ in the FIGURE, the kind of ingredients such as addition polymerizable monomer, light polymerization initiator and binder, or the ratio of such ingredients, differs in each layer. However, in general, the kind of binder or the amount of binder is changed in each layer in consideration of the purposes of the present invention.

One of main objects of the present invention is to form a resist pattern on a substrate for printed circuits having through-holes by a stripping development process wherein the film strength of the resist pattern over the through-holes is sufficient not to break by the mechanical shock of etching which is used to eliminate metal areas (copper in many cases) where the resist pattern has not been formed.

As the addition polymerizable monomers comprising the photosensitive layers, any monomer can be used if it has at least one addition-polymerizable unsaturated bond, preferably at most 6 of such unsaturated bonds. Example of such monomers include acrylic acid esters, acrylamides, methacrylic acid esters, methacrylamides, allyl compounds, vinyl ethers, N-vinyl compounds, styrenes, crotonic acid esters and the like.

Further, compounds represented by the following formula (1), which are called polyester acrylate (methacrylate)s and which are prepared by esterifying acrylic acid or methacrylic acid and one or more polybasic acids with one or more polyhydric alcohols are suitably used as "monomers" in the present invention:

(1)

wherein R represents a hydrogen atom or a methyl group, X represents an ester group containing at least one ester bond composed of one or more polyhydric alcohols and one or more polybasic acids, and $n$ is an integer of 1 to 6. Preferred polyhydric alcohols are aliphatic polyhydroxy compounds which contain from 2 to 30 carbon atoms, more preferably from 2 to 20 carbon atoms and have from 2 to 6-OH groups, more preferably from 2 to 4-OH groups. Good results are obtained utilizing such aliphatic polyhydroxy compounds having a molecular weight of from 60 to about 700, more preferably from 60 to about 500. Preferred polybasic acids have from 3 to 30 carbon atoms, more preferably from 4 to 20 carbon atoms (including the carboxylic carbon atom) and contain from 2 to 6 COOH groups, more preferably from 4-COOH groups. Such polybasic acids have a molecular weight of from 104 to about 600, with excellent results being obtained using polybasic acids having a molecular weight of from 116 to about 500.

For those polybasic acids which comprise an aromatic ring, such a ring may be substituted, and, in such instance, the substituent is more preferably an alkyl group of from 1 to 5 carbon atoms, halogen (Cl, Br, I) or a haloalkyl group comprising an alkyl moiety of from 1 to 5 carbon atoms and Cl, Br or I.

Examples of the compounds having one addition polymerizable unsaturated bond include acrylic acid derivatives, for example, acrylic acid, alkyl acrylates (preferably wherein the alkyl group has from 1 to 10 carbon atoms, most preferably from 1 to 5 carbon atoms, for example, propyl acrylate, butyl acrylate, amyl acrylate, ethylhexyl acrylate, octyl acrylate, t-octyl acrylate, chloroethyl acrylate, hydroxyethyl acrylate hydroxypropyl acrylate, 2,2-dimethylhydroxypropyl acrylate, 5-hydroxypentyl acrylate, diethyleneglycol monoacrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate, etc.) and aryl acrylates (most preferably comprising 1 or 2 condensed aromatic rings, for example, a phenyl, naphthyl, substituted phenyl or substituted naphyl group, of which illustrative groups are phenyl-, cresyl-, naphthyl-, tolyl-, nitrophenyl-, hydroxyphenyl- acrylate, etc.); methacrylic acid derivatives, for example, methacrylic acid, alkyl methacrylates (preferably wherein the alkyl group has from 1 to 10 carbon atoms, most preferably from 1 to 5 carbon atoms, for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, N-ethyl-N-phenylamino ethyl methacrylate, ethyleneglycol monomethacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, 2,2-dimethyl-3-hydroxypropyl methacrylate, diethylene glycol monomethacrylate, trimethylolpropane monomethacrylate, pentaerythritol monomethacrylate, glycidyl methacrylate, furfuryl methacrylate and tetrahydrofurfuryl acrylate, etc.) and aryl methacrylates (most preferably comprising 1 of 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl- methacrylate, etc.); acrylamides, for example, acrylamide, N-alkyl acrylamides (preferably wherein the alkyl group has from 1 to 10 carbon atoms, most preferably from 1 to 5 carbon atoms, for example, a methyl group, ethyl group, propyl group, butyl group, t-butyl group, heptyl group, octyl group, cyclohexyl group, benzyl group, hydroxymethyl group, hydroxyethyl group and benzyl group, etc.), N-aryl acrylamides (most preferably comprising 1 or 2 condensed aromatic rings, for example, a phenyl, naphthyl, substituted phenyl or substituted naphthyl group, of which illustrative groups are phenyl-, cresyl-, napht- hyl-, tolyl-, nitrophenyl-, hydroxyphenyl- acrylamides, etc.), N,N-dialkyl acrylamides (preferably wherein the alkyl group has from 1 to 10 carbon atoms, most preferably from 1 to 5 carbon atoms, e.g., a methyl group, ethyl group, butyl group, isobutyl group, ethylhexyl group and cyclohexyl group, etc.), N,N-diaryl acrylamides (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl- as the aryl groups in the N,N-diaryl acrylamides), N-methyl-N-phenyl acrylamide, N-hydroxyethyl-N-methyl acrylamide and N-2-acetamidoethyl-N-acetyl acrylamide, etc.; methacrylamides, for example, methacrylamide, N-alkyl methacrylamides (preferably wherein the alkyl group has from 1 to 10 carbon atoms, most preferably from 1 to 5 carbon atoms, e.g., a methyl group, ethyl group, t-butyl group, ethylhexyl group, hydroxyethyl group and cyclohexyl group, etc.), N-aryl methacrylamides (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl- methacrylamides, etc.), N,N-dialkyl methacrylates (preferably wherein the alkyl group has from 1 to 10 carbon atoms, most preferably from 1 to 5 carbon atoms, e.g., an ethyl group, propyl group and butyl group, etc.), N,N-diaryl methacrylamides (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl-as the aryl group in the N,N-diaryl methacrylamide), N-hydroxyethyl-N-methyl methacrylamide, N-methyl-N-phenyl methacrylamide and N-ethyl-N-phenyl methacrylamide, etc.; allyl compounds where any alkyl moiety comprises from 1 to 10 carbon atoms, preferably from 1 to 5 carbon atoms, and wherein Any aryl group comprises 1 or 2 (condensed) aromatic rings, for example allyl esters (for example, allyl acetate, allyl caproate, allyl caprylate, allyl laurate, allyl palmitate, allyl stearate, allyl benzoate, allyl acetoacetate and allyl lactate, etc.) and allyloxyethanol, etc; vinyl ethers, for example, alkyl vinyl ethers (where preferably the alkyl moiety comprises from 1 to 18 carbon atoms, most preferably from 1 to 10 carbon atoms, for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethyl-butyl vinyl ether, hydroxyethyl vinyl ether, diethyleneglycol vinyl ether, dimethylaminoethyl vinyl ether, diethylaminoethyl vinyl ether, butylaminoethyl vinyl ether, benzyl vinyl ether and tetrahydrofurfuryl vinyl ether, etc.) and vinyl aryl ethers (where the aryl moiety most preferably has 1 or 2 (condensed) aromatic rings, e.g., for example, vinyl phenyl ether, vinyl tolyl ether, vinyl chlorophenyl ether, vinyl-2,4-dichlorophenyl ether, vinyl naphthyl ether and vinyl anthranyl ether, vinyl cresyl ether, vinyl nitrophenyl ether, vinyl hydroxyphenyl ether, etc.); vinyl esters, wherein any alkyl moiety preferably has from 1 to 10 carbon atoms, most preferably 1 to 5 carbon atoms, and wherein the aryl moiety comprises 1 or 2 (condensed) aromatic rings, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinyl cyclohexyl carboxylate, vinyl benzoate, vinyl salicylate, vinyl chlorobenzoate, vinyl tetrachlorobenzoate and vinyl naphthoate, etc.; N-vinyl compounds, for example, N-vinyloxazolidone, N-vinylimidazole, N-vinylpyrrolidone, N-vinylcarbozole and N-vinylethylacetamide, etc, styrenes, including styrenes wherein carbon atoms in the phenyl ring thereof are substituted and α-substituted styrenes, for example alkylstyrenes (preferably where the alkyl group has 1 to 18 carbon atoms, most preferably 1 to 10 carbon atoms, for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene, etc.), alkoxystyrenes (preferably where the alkoxy group has 1 to 10 carbon atoms, most preferably 1 to 5 carbon atoms, for example, methoxystyrene, 4-methoxy-3-methylstyrene and dimethoxystyrene, etc.), halogenostyrenes (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene, etc.), and carboxystyrenes (for example, vinyl benzoic acid, and vinyl benzoic acid methyl ester, etc.); crotonic acid esters, for example, alkyl crotonates (preferably where the alkyl group has 1 to 18 carbon atoms, most preferably 1 to 10 carbon atoms, for examples, butyl crotonate, hexyl crotonate and glycerine monocrotonate, etc.); and a polyester acrylate (methacrylate) (for example, compounds represented by the formulae Y-OCH$_2$CH$_2$OOC-CH=CH-COO-CH$_2$CH$_2$OH, COO(OCH$_2$CH$_2$)$_2$OH, wherein Y represents a CH$_2$=CH—CO— or group).

In the following, compounds having two or more, preferably 2 to 6, addition polymerizable unsaturated bonds are described, which are used as more preferred monomers than the above described compounds having one addition polymerizable unsaturated bond.

As acrylic acid esters and methacrylic acid esters, there are polyacrylates and polymethacrylates of polyhydric alcohols, preferably those polyhydric alcohols having from 1 to 10 carbon atoms, most preferably 1 to 5 carbon atoms (polyacrylates and polymethacrylates mean esters which have two or more ester groups).

Examples of the above described polyhydric alcohols include polyethylene glycol, polypropylene oxide, polybutylene oxide, polycyclohexene oxide, polyethylene oxide-propylene oxide, polystyrene oxide, polyoxetane, polytetrahydrofuran, cyclohexanediol, xylene-diol, di(β-hydroxyethoxy)benzene, glycerine, diglycerine neopentyl glycol, trimethylol propane, triethylol propane, pentaerythritol, dipentaerythritol, sorbitan, sorbitol, butanediol, butanetriol, 2-butene-1,4-diol, 2-n-butyl-2-ethyl-propanediol, 2-butine-1,4-diol, 3-chloro-1,2-propanediol, 1,4-cyclohexanedimethanol, 3-cyclohexene-1,1-dimethanol, decalinediol, 2,3-dibromo-2-butene-1,4-diol, 2,2-diethyl-1,3-propanediol, 1,5-dihydroxy-1,2,3,4-tetrahydronaphthalene, 2,5-dimethyl-2,5-hexanediol, 2,2-dimethyl-1,3-propanediol, 2,2-diphenyl-1,3-propanediol, dodecanediol, mesoerythritol, 2-ethyl-1,3-hexanediol, 2-ethyl-2-(hydroxymethyl)-1,3-propanediol, 2-ethyl-2-methyl-1,3-propanediol, heptanediol, hexanediol, 3-hexene-2,5-diol, hydroxybenzyl alcohol, hydroxyethyl resorcinol, 2-methyl-1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xylene-α,α'-diol, 1,1,4,4-tetraphenyl-1,4-butanediol, 1,1,4,4-tetraphenyl-2-butine-1,4-diol, 1,2,6-trihydroxyhexane, 1,1'-bi-2-naphthol, dihydroxynaphthalene, 1,1'-methylene-di-2-naphthol, 1,2,4-benzene triol, biphenol, 2,2'-bis-(4-hydroxyphenyl)-butane, 1,1-bis-(4-hydroxyphenyl)-cyclohexane, bis-(hydroxyphenyl)-methane, catechol, 4-chlororesorcinol, 3,4-dihydroxyhydrocinnamic acid, hydroquinone, hydroxybenzyl alcohol, methylhydroquinone, methyl-2,4,6-trihydroxybenzoate, phloroglucinol, pyrogallol, resorcinol, glucose, α-(1-aminoethyl)-p-hydroxybenzyl alcohol, 2-amino-2-ethyl-1,3-propane-diol, 2-amino-2-methyl-1,3-propanediol, 3-amino-1,2-propanediol, N-(3-aminopropyl)-diethanolamine, N,N'-bis-(2-hydroxyethyl)-piperazine, 2,2-bis-(hydroxymethyl)-2,2',2"-nitrilotriethanol, 2,2-bis(hydroxymethyl)-propionic acid, 1,3-bis-(hydroxymethyl)-urea, 1,2-bis-(4-pyridyl)-1,2-ethanediol, N-n-butyl-diethanolamine, diethanolamine, N-ethyl-diethanolamine, 3-mercapto-1,2-propanediol, 3-piperidino-1,2-propanediol, 2-(2-pyridyl)-1,3-propanediol, triethanolamine, α-(1-aminoethyl)-p-hydroxybenzyl alcohol and 3-amino-4-hydroxyphenyl sulfone, etc.

Among these acrylic acid esters and methacrylic acid esters, most preferred examples include ethyleneglycol diacrylate, diethyleneglycol dimethacrylate, polyethyleneglycol diacrylate, pentaerythritol triacrylate, pentaerythritol dimethacrylate, dipentaerythritol pentaacrylate, glycerine triacrylate, diglycerine dimethacrylate, 1,3-propanediol diacrylate, 1,2,4-butanetriol trimethacrylate, 1,4-cyclohexanediol diacrylate, 1,5-pentanediol diacrylate, neopentylglycol diacrylate, and triacrylates of trimethylolpropane to which ethylene oxide has been added, because of their availability. Preferred polyethylene glycols have a molecular weight of from 60 to about 600, more preferably from 60 to about 400 and preferred polypropylene glycols have a molecular weight of from 76 to about 700, more preferably from 76 to about 500.

On the other hand, as the acrylamides and methacrylamides, with preferred acrylamides and methacrylamides including those combined with a diamine, triamine or tetraamine, and containing from 1 to 10 carbon atoms, most preferably such compounds combined with a diamine having a total of 1 to 6 carbon atoms, there are methylenebisacrylamide, methylenebismethacrylamide, and those which are obtained from reaction between (meth)acrylic acid and the following amines, and polyacrylamides and polymethacrylamides of ethylenediamine, diaminopropane, diaminobutane, pentamethylenediamine, hexamethylenediamine, bis-(2-aminopropyl)-amine, diethylenetriamine, heptamethylenediamine, octamethylenediamine, polyamines, including dimaines, triamines and tetraamines, most preferably diamines, having a total molecular weight of from 46 to about 300, most preferably 60 to about 200, having a methylene group chain interrupted by one or more hetero atoms, e.g., S, O, N, etc., and polyamines having a ring (preferably those with from 1 to 3 (condensed) aromatic rings, most preferably with 1 ring, for example, phenylenediamine, xylylenediamine, β-(4-aminophenyl)-ethylamine, diaminobenzoic acid, diaminotoluene, diaminoanthraquinone and diaminofluorene, etc.).

As allyl compounds, there are diallyl esters of dicarboxylic acids, where the dicarboxylic acids preferably have from 1 to 20 carbon atoms (including the carbon atom of the carboxyl group), most preferably from 1 to 10 carbon atoms, and when a ring-system dicarboxylic acid is used, it preferably has from 1 to 3 (condensed) aromatic ring, most preferably 1 ring, for example, phthalic acid, terephthalic acid, sebacic acid, adipic acid, glutaric acid, malonic acid and oxalic acid, etc., diallyl esters and diallylamides of disulfonic acids, preferably those containing from 1 to 20 carbon atoms, most preferably from 1 to 10 carbon atoms and, when a ring-system disulfonic acid is involved, the number of aromatic rings is from 1 to 3 (condensed), most preferably 1, such as anthraquinone disulfonic acid, benzenedisulfonic acid, 2,5-dihydroxy-p-benzenedisulfonic acid, dihydroxynaphthalene disulfonic acid and naphthalene disulfonic acid, etc.

As vinyl ethers, which preferably contain from 1 to 9, most preferably from 1 to 4, vinyl groups, there are polyvinyl ethers of the above described polyhydric alcohols, most preferably those of a molecular weight of from 90 to about 500, most preferably from 104 to 400, such as ethylene glycol divinyl ether, 1,3,5-tri-β-vinyloxyethoxybenzene, 1,3-di-β-vinyloxyethoxybenzene and glycerol trivinyl ether, etc.

As vinyl esters, most preferably esters of vinyl alcohols with a dicarboxylic or tricarboxylic acid having from 1 to 10 carbon atoms, most preferably 1 to 6 carbon atoms (which ranges include the carboxyl carbon), or a disulfonic or trisulfonic acid having from 1 to 10 carbon atoms, most preferably 1 to 6 carbon atoms, there are divinyl succinate, divinyl adipate, divinyl phthalate, divinyl terephthalate, divinylbenzene-1,3-disulfonate and divinylbutane-1,4-disulfonate, etc.

As styrene compounds, most preferably those styrene compounds wherein a phenyl proton is substituted by a vinyl, alkyl or alkenyl gruoup of from 1 to 10 carbon atoms, most preferably 1 to 5 carbon atoms, there are divinylbenzene, p-allylstyrene and p-isopropenestyrene, etc.

Further, compounds having two different addition polymerizable unsaturated bonds such as N-β-hydroxyethyl-β-(methacrylamide)-ethylacrylate, N,N-bis-(β-methacryloxyethyl)-acrylamide and allyl methacrylate, etc., can be suitably used in the present invention.

As polyester acrylate (methacrylate)s having two or more addition polymerizable unsaturated bonds, there are many compounds which are synthesized from acrylic acid and/or methacrylic acid, one or more polyhydric alcohols and one or more polybasic acids. Examples of such compounds include the following.

Y—OCH$_2$CH$_2$OOC—C$_6$H$_4$—COOCH$_2$CH$_2$O—Y,

Y—(OCH$_2$CH$_2$OOC—C$_6$H$_4$—CO)$_2$—OCH$_2$CH$_2$O—Y,

Y—O—(CH$_2$CH$_2$O)$_5$—OC—CH=CH—CO—(OCH$_2$CH$_2$)$_5$—O—Y,

Y—(OCH$_2$CH$_2$)$_5$OOC—(CH$_2$)$_4$—CO)$_2$—O—(CH$_2$CH$_2$O)$_5$—Y,

Y—(OCH$_2$CH$_2$)$_5$OOC—C$_6$H$_4$—CO)$_2$—O—(CH$_2$CH$_2$O)$_5$—Y,

Y—(OCH$_2$CH$_2$)$_{10}$—OOC—CH$_2$—COO—(CH$_2$CH$_2$O)$_{10}$—Y,

-continued (wherein Y represents either a CH$_2$=CH-CO- or a group, -OC-C$_6$H$_4$-CO- is a phthalic acid residue, an isophthalic acid residue or a terephthalic acid residue, and -OC-CH-CH-CO- is a maleic acid residue or a fumaric acid residue). Further, Aronix (tradename; produced by Toa Gosei Chemical Industry Co., Ltd.) can be used as the polyester acrylate (methacrylate) in the present invention.

The preferred monomers include acrylic esters and methacrylic esters with the polyol moiety thereof (polyhydroxy compound) containing from 1 to 6 hydroxy groups.

These monomers may be used alone or as a mixture of two or more thereof.

On the other hand, conventional light polymerization initiators can be used in the present invention. For example, there are carbonyl compounds, organic sulfur compounds, peroxides, redox type compounds, azo and diazo compounds, halogen compounds, light reducible dyestuffs and imidazoles, etc., as described in "Light Sensitive Systems", Chapter 5, writted by J. Kosar. As is well known to those skilled in the art, such photopolymerization initiators when exposed to light having a wavelength which the initiators absorb produce free radicals which initiate free radical addition polymerization. So long as photopolymerization initiator meets this general criterion, it can be used with success in the present invention. Examples thereof are as follows:

As carbonyl compounds, benzoin, benzoin methyl ether, benzophenone, anthraquinone, 2-methylanthraquinone, 2-t-butylanthraquinone, 9,10-phenanthrenequinone, diacetyl, benzil and compounds represented by the following formula are useful.

In the formula, $R_1$ represents an alkyl group as is conventional in cyanine dyes, wherein the alkyl group preferably has from 1 to 10 carbon atoms, most preferably 1 to 5 carbon atoms, for example, which term includes both unsubstituted lower alkyl groups such as a methyl group, ethyl group or propyl group, and substituted alkyl groups such as a hydroxyalkyl group where the alkyl moiety preferably has from 1 to 10 carbon atoms, most preferably 1 to 5 carbon atoms, such as a 2-hydroxyethyl group; an alkoxyalkyl group where the alkoxy and alkyl moieties each preferably have from 1 to 10 carbon atoms, most preferably 1 to 5 carbon atoms, such as a 2-methoxyethyl group; a carboxyalkyl group such as a carboxymethyl group or 2-ethyl group, a sulfoalkyl group where the alkyl moiety preferably has from 1 to 10 carbon atoms, most preferably 1 to 5 carbon atoms, such as a 2-sulfoethyl group or 3-sulfopropyl group; and aralkyl group where the aryl ring preferably comprises 1 benzene ring and the alkyl group is a polymethylene group of from 1 to 10 carbon atoms, most preferably from 1 to 8 carbon atoms, such as a benzyl group, phenethyl group, p-sulfophenetyl group or p-carboxyphenetyl group; or a vinylmethyl group, $R_2$ represents an alkyl group (generally with 1 to 10 carbon atoms in the alkyl group, more preferably from 1 to 5 carbon atoms, for example, a lower alkyl group such as a methyl group, ethyl group or propyl group); an aryl group (where preferred aryl groups have from 6 to 15 carbon atoms, most preferably from 6 to 12 carbon atoms, and comprise 1 or 2 (condensed) aromatic rings, for example, a phenyl group, p-hydroxyphenyl group, p-methoxyphenyl group, p-chlorophenyl group or naphthyl group, etc.) or a thienyl group; and Z represents a group of non-metallic atoms necessary to form a nitrogen containing heterocyclic nucleus as is commonly used in the cyanine dye art, such as a benzothiazole nucleus (for example, benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole or 5,6-dimethoxybenzothiazole, etc.), as a naphthothiazole nucleus (for example, α-naphthothiazole or β-naphthothiazole, etc.), a benzoselenazole nucleus (for example, benzoselenazole, 5-chlorobenzoselenazole, 6-methylbenzoselenazole or 6-methoxybenzoselnazole, etc.), a naphthoselenazole nucleus (for example, α-naphthoaoselenazole or β-naphthoselenazole, etc.), a benzoxazole nucleus (for example benzoxazole, 5-methylbenzoxazole, 5-phenylbenzoxazole, or 6-methoxybenzoxazole, etc.) or a naphthoxazole nucleus (for example, α-naphthoxazole or β-naphthoxazole, etc.).

Examples of the compounds represented by the above described formula include 2-benzoylmethylene-3-methyl-β-naphthothiazoline, 2-benzoylmethylene-3-ethyl-β-naphthothiazoline, 3-ethyl-2-(2-thenoyl)-methylene-β-naphthothiazoline, 3-ethyl-2-propionylmethylene-β-naphthothiazoline, 5-chloro-3-ethyl-2-p-methoxybenzoylmethylene benzothiazoline, etc.

As organic sulfur compounds, there are di-n-butyldisulfide, di-n-octyldisulfide, dibenzylsulfide, diphenyldisulfide, dibenzoyldisulfide, diacetyldisulfide, 2-mercaptobenzothiazole, 2-mercaptobenzoxazole, 2-mercaptobenzimidazole, thiophenol, thiocresol, p-methoxybenzenethiol, carboxymethyl-n, n-dimethyldithiocarbamate and ethyl-trichloromethane sulfonate, etc.

As peroxides, there are hydrogen peroxide, di-t-butyl peroxide, benzoyl peroxide and methyl ethyl ketone peroxide, etc.

The redox compounds are composed of a combination of a peroxide and a reducing agent, such as ferrous ion and hydrogen peroxide, ferrous ion and persulfuric acid ion or ferric ion and hydrogen peroxide, etc.

As azo and diazo compounds, there are α,α'-azobisisobutyronitrile, 2-azobis-2-methylbutyronitrile, 1-azo-biscyclohexanecarbonitrile and p-amidophenylamine diazonium salt, etc.

As halogen compounds, there are chloromethylnaphthyl chloride, phenacyl chloride, chloroacetone, β-naphthalenesulfonyl chloride and xylene sulfonyl chloride, etc.

As light reducible dyestuffs, there are Rose Bengal, Erythrocin, Eosine, Acriflavin, Riboflavin, Thionine, etc.

As imidazoles, there are 2-o-chlorophenyl-4,5-diphenylimidazolyl dimer, 2-o-fluorophenyl-4,5-diphenylimidazolyl dimer, 2-p-methylmercaptophenyl-4,5-diphenylimidazolyl dimer bis-(2,4,5-triphenylimidazolyl), etc.

The light polymerization initiators are used in an amount of about 0.1 to about 20 parts preferably 1 to 10 parts, per 100 parts by weight of the monomer.

It is preferred to add a heat polymerization inhibitor to the light polymerizable composition used in the present invention. Examples of the heat polymerization inhibitors include p-methoxyphenol, hydroquinone, alkyl or aryl substituted hydroquinones, e.g., methyl, ethyl or phenyl, t-butylcatechol, pyrogallol, cuprous chloride, phenothiazine, chloranil, naphthylamine, β-naphthol, 2,6-di-t-butyl-p-cresol, pyridine, nitrobenzene, dinitrobenzene, p-toluidine, Methylene Blue and organic acid copper salts (for example, copper acetate), etc. The heat polymerization inhibitor is included in an amount of about 0.001 to about 5 parts by weight per 100 parts by weight of the monomer.

The polymer used as the binder can be selected according to the purpose of use from various synthetic, semi-synthetic and natural high molecular weight materials, the compatibility of which is good with the monomers annd the light polymerization initiator so as not to cause separation at preparation, application or drying of the coating solution, upon consideration of the strength, stretching property, antiabrasive property, chemical resistance, softening point and crystallinity of the polymer.

Examples of polymers used as binders include chlorinated polyethylene, chlorinated polypropylene, both preferably of a degree of chlorination of about 20 to about 80 % by weight, polymethyl methacrylate, polyacrylic acid, polymethacrylic acid, polyacrylic acid alkyl esters (where the alkyl group has preferably 1 to 10 carbon atoms, most preferably 1 to 5 carbon atoms, for example, where the alkyl group includes a methyl group, ethyl group, butyl group, etc.), copolymers of an acrylic acid alkyl ester, examples of alkyl groups including those as set for the polyacrylic acid alkyl esters, and at least one monomer such as acrylonitrile, vinyl chloride, vinylidene chloride, styrene or butadiene, etc., polyvinyl chloride, vinyl chloride-acrylonitrile copolymers, polyvinylidene chloride, vinylidene chloride-acrylonitrile copolymers, polyvinyl acetate, vinyl acetate-vinyl chloride copolymers, polyvinyl alcohol, polyvinyl pyrrolidone, polyacrylonitrile, acrylonitrile-styrene copolymers, acrylonitrilebutadiene-styrene terpolymers (where preferred terpolymers contain from 20 to 30 mol% acrylonitrile, from 20 to 30 molar % butadiene and from 40 to 60 molar % styrene), polyvinyl alkyl ethers (where the alkyl group preferably has 1 to 10 carbon atoms, most preferably 1 to 5 carbon atoms, for example, the alkyl groups include a methyl group, ethyl group, isopropyl group, butyl group, etc.), polymethyl vinyl ketone, polyethyl vinyl ketone, polyethylene, polypropylene, polybutene, polystyrene, poly-α-methylstyrene, polyamides (nylon-6, nylon-6,6, etc.), poly-1,3-butadiene, polyisoprene, polyurethanes, polyethylene terephthalate, polyethylene isophthalate, chlorinated rubber, chlorinated polyisoprene, chlorinated polybutadiene, etc., (such materials typically have a degree of chlorination of 60% or more and, simply stated, have no impact upon the chlorination degree of the chlorinated polyolefin(s) used), cyclized rubbers such as cyclized polyisoprene, ethyl cellulose, acetyl cellulose, polyvinyl butyral, polyvinyl formal, styrene-butadiene rubbers (preferably where the ratio butadiene/(styrene + butadiene) is 0.5 – 0.1, most preferably with a styrene : butadiene ratio of 75:25, all by weight), etc. In the case of the copolymers, though the ratio of monomers can be varied in a wide range, it is preferred that the molar ratio of the minor component be 10 – 50% (where the minor component is the last recited component and in terpolymers represented by A - B - C, the proportion of the components is A>B>C).

Polymers comprising each layer of the photosensitive element can be selected from the above described polymers. In each layer, only one polymer may be used or two or more polymers may be used together.

In the image forming process of the present invention, images are formed by stripping development, whereby exposed portions adhere to the substrate and non-exposed portions adhere to the support. Accordingly, it is necessary, in order to obtain good images without fogging, that the adhesive strength A between the support and the photosensitive layer remarkably decrease to A' after exposure to light, and, further, it is necessary that the photosensitive layer be easily cut and separated at a boundary between exposed portions and non-exposed portions by stripping development. As a binder for a photosensitive layer having such properties, it is particularly preferred to use chlorinated polymers such as chlorinated polyethylene, chlorinated polypropylene, chlorinated rubbers, polymers composed of vinylidene chloride as a major ingredient, i.e., more than 50 mol% of vinylidene chloride etc., alone or together with a minor amount of one or more other polymer, e.g., those earlier recited which are not here recited as preferred. These chlorinated polymers generally have a comparatively low molecular weight in a range of about 5,000 to about 500,000, preferably 5,000 to 100,000. It is preferred that the layer comprising these polymers as one binder ingredient be placed as a layer adjacent the support. However, such a layer may also be placed as a layer which directly contacts the substrate, or two of such layers may be placed so as to contact both the support and the substrate, respectively. It is generally preferred that outermost sublayers have a thickness of from about 3 to about 30 μ more preferably 5 to 20 μ, while intermediate layers, that is, interior sublayers, have a thickness of from about 10 to about 50 μ, more preferably 15 to 40 μ.

In the image forming process of the present invention, it is secondly important that one or more layers containing polymers having high strength as the binder are disposed in the photosensitive element for the purpose of increasing the strength of the resist film. It is particularly preferred that such layers be disposed so as not to contact the support and the substrate. As polymers used for such purpose, there are various materials. However, polymers having a comparatively high molecular weight in a range of about 10,000 to about 5,000,000, preferably 100,000 to 2,000,000, are preferred. These polymers may be used alone or as a mixture of two or more thereof. In general, if polymers having a high strength are used, it is difficult to cause breaking of the photosensitive layers at a boundary between exposed portions and non-exposed portions at stripping development, and, consequently, it is difficult to obtain sharp images of good quality. In such a case, image properties can be improved by using a small amount of the above described chlorinated polymers together, for example, on the order of 5 to 30 weight %, more preferably 10 to 20 weight %.

As described above, it is a most important characteristic of the present invention to provide a photosensitive element consisting of a layer having a function of giving good image properties and a layer having a function of forming a strong resist film by using different polymers (that is, polymers where the identity of the monomeric components thereof differ) or polymers each having a different composition (that is, polymers where the monomeric components are identical but the ratio between different polymers is different) or molecular weight as the binder in each layer, whereby the synergistic function of both polymers is given to the whole photosensitive element and an effect which could not be obtained in stripping development photosensitive materials using each layer alone is exhibited.

The adhesive strength between the photosensitive layer and the support or the substrate can be adjusted within a wide range by changing the kind of the binder and the mixing ratio of the binder ingredients or the kind of the monomer. Further, the above adhesive strength can also be adjusted by changing the ratio of the binder to the monomer. In general, the ratio by weight of the binder to the monomer is in a range of about 2 to about 0.2, preferably 1.5 to 0.3, per 100 parts by weight of the binder(s) present in that sublayer.

The light polymerizable composition used in the present invention can contain various conventional additives such as a coloring agent, a plasticizer, a resin, etc.

As the coloring agent, there are pigments such as titanium oxide, carbon black, iron oxide, phthalocyanine pigments and azo pigments, and dyestuffs such as Methylene Blue, Crystal Violet, Rhodamine B, Fuchsine, Auramine, azo dyes and anthraquinone dyes, etc. It is preferred that the coloring agent not absorb light of the absorption wavelength of the light polymerization initiator. The amount of the coloring agent used is preferably in the range of about 0.1 to about 30 parts by weight per 100 parts by weight of the sum total of the binder and the monomers in the case of a pigment and about 0.01 to about 30 parts by weight, preferably 0.1 to 3 parts by weight, in the case of a dyestuff.

As the plasticizer, there can be illustrated phthalic acid esters such as dimethyl phthalate, diethyl phthalate, dibutyl phthalate, diisobutyl phthalate, dioctyl phthalate, octyl capryl phthalate, dicyclohexyl phthalate, di-tridecyl phthalate, butyl benzyl phthalate, diisodecyl phthalate and diallyl phthalate, etc., glycol esters such as dimethylglycol phthalate, ethyl phthalyl ethylglycolate, methylphthalyl ethylglycolate, butylphthalayl butylglycolate and triethylene glycol dicaprylate, etc., phosphoric acid esters such as tricresyl phosphate and triphenyl phosphate, etc., aliphatic dibasic acid esters such as diisobutyl adipate, dioctyl adipate, dimethyl sebacate, dibutyl sebacate, dioctyl azelate and dibutyl maleate, etc., triethyl citrate, glycerine triacetyl ester and butyl laurate. Usually from 0 to about 20% plasticizer is used.

The light polymerizable composition used in the present invention is dissolved in a solvent to form a coating solution, which is then applied to the support and dried.

The solvent in the coating solution is not overly important, and examples thereof include ketones such as acetone, methyl ethyl ketone, methyl isobutyl ketone, cyclohexanone and diisobutyl ketone, etc., esters such as ethyl acetate, butyl acetate, n-amyl acetate, methyl formate, ethyl propionate, dimethyl phthalate and ethyl benzoate, etc., aromatic hydrocarbons such as toluene, xylene, benzene and ethylbenzene, etc., halogenated hydrocarbons such as carbon tetrachloride, trichloroethylene, chloroform, 1,1,1-trichloroethane, monochlorobenzene and chloronaphthalene, etc., ethers such as tetrahydrofuran, diethyl ether, ethyleneglycol monomethyl ether and ethylene glycol monoethyl ether acetate, etc., dimethylformamide and dimethyl sulfoxide, etc. If desired, one can provide a subbing layer to facilitate adhesion or an antihalation layer on the surface of the support.

It is necessary that the support used in the present invention have good light transparency, e.g., 50% or more and good surface uniformity. Examples of the support used include plastic films such as polyethylene terephthalate, polypropylene, polyethylene, triacetyl cellulose, diacetyl cellulose, polyvinyl chloride, polyvinyl alcohol, polycarbonate, polystyrene, cellophane, vinylidene chloride- e.g., acrylonitrile or vinyl acetate copolymers, polyamide, polyimide, vinyl chloride-vinyl acetate copolymers, polytetrafluoroethylene, polytrifluoroethylene, etc. A composite material composed of two or more of the above described materials can also be used.

In general, a support having about a 10 to about 150 $\mu$, preferably a 2 to 50 $\mu$, thickness is used, but supports having a thickness outside the above range can also be used.

The photosensitive material used in the present invention can be produced as follows. Namely, the monomer(s), the light polymerization initiator(s), the binder(s) and optional ingredients for each layer are dissolved or dispersed in a solvent(s) and each resultant mixture is applied to the transparent support in a suitable amount and dried to form a layer. This procedure of application and drying is repeated to produce a photosensitive material having a photosensitive element composed of two or more layers on the transparent support. Drying after application is preferably carried out at about 30° to about 130° C, most preferably 50° to 100° C.

The total thickness of the photosensitive layers on the support after drying is set so that the final resist pattern meets its desired function. Generally, it is in range of about 5 to about 100 $\mu$, preferably 10 to 60 $\mu$.

It is difficult to store the resultant photosensitive material in piles or in a roll because the surface of the photosensitive layer thereof generally has a comparatively high stickiness. Therefore, the back (the reverse face of the resist layer) of the transparent support may be subjected to processing to render the support less adhesive to the photosensitive layer or a protective film may be provided on the photosensitive layer for the purpose of storage. Such a protective film can be suitably selected from the above described materials for the support, paper and paper laminated with polyethylene or polypropylene, etc. The thickness of the protective film is not overly important but it is generally in the range of about 8 to about 80 $\mu$, preferably 10 to 50 $\mu$. It is necessary in this case that the adhesive strength A between the light polymerizable composition layer and the support be higher than the adhesive strength B between the light polymerizable composition layer and the protective film. For example, it is possible to use support protective film combinations as shown in the following Table 1.

Table 1

| | Support | Protective film |
|---|---|---|
| (1) | Polyethylene terephthalate | Polypropylene |
| (2) | Polyethylene terephthalate | Polyethylene |
| (3) | Polyamide (Nylon-6) | Polyethylene |
| (4) | Polyvinyl chloride | Cellophane |
| (5) | Polyimide | Polypropylene |

Further, in addition to selecting the support and the protective film as described above so as to not be the same, it is possible to satisfy the above described adhesive strength relationship by carrying out a surface processing of at least one of the support and the protective film. The surface processing of the support is generally carried out to increase adhesive strength to the light polymerizable composition layer. For example, there is the application of a subbing layer, a corona discharge, a flame processing, ultraviolet ray application, high frequency wave application, glow discharge, active plasma application, laser irradiation, On the other hand, surface processing of the protective film is generally carried out in order to lower adhesive strength to the light polymerizable composition layer. For example, one can apply a subbing layer of a polyorganosiloxane, a fluorinated polyolefin, polyfluoroethylene, or the like.

In the following, a process of forming patterns using the above described photosensitive material is illustrated. In the case that the photosensitive material has a protective film, the protective film is stripped off to expose a surface of the photosensitive layer. The photosensitive material is then pressed against a clean surface of a substrate to form a laminate. The temperature at lamination is selected according to the surface properties of the photosensitive layer such as the stickness or heat plasticity thereof, which depend upon the composition of the photosensitive layer. Usually, it is in the range of about 15° to about 60° C.

As the substrate, various materials can be used in the present invention. For example, plastic films as were exemplified for the support, selected, of course, to be different from the plastic of the support, paper, wood metal plates or glass plates, all which have an adhesive strength to the photosensitive layer different from that of the support can be used. Particularly, in the case that the present invention is used for forming photoresist images for printed circuits, for printed circuit substrates which are produced by laminating or plating a thin metal layer such as a copper, aluminium or silver layer on a surface of a plastic plate or on the inside faces of through-holes of the plastic plate, or base plates having a thin metal layer which are produced by depositing by evaporation or plating the metal on a thin plastic film can be used.

Further, in the case that the present invention is used for making lithographic printing plates, aluminium plates and plastic films having an aluminium layer can be used in addition to the above described various base plates. In this case, a surface of the metal plate such as an aluminium plate may be subjected to various conventional processings to render the same hydrophilic, such as anodic oxidation or a silicate processing, etc.

On a commercial scale, extremely excellent process efficiency is obtained utilizing a polyethylene terephthalate support in combination with a substrate of copper (or a copper/plastic, typically epoxy, laminate) or aluminium.

The resultant photosensitive material having laminated layers on the substrate is then image-wise exposed to an original through the transparent support. As a light source, one which emits electromagnetic waves which pass through the transparent support and are active to the light polymerization initiator(s) in the photosensitive layers, such as ultraviolet-visible rays having about a 300 to about a 700 m$\mu$, particularly a 350 to 500 m$\mu$, wavelength are used. For example, a high pressure mercury lamp, a xenon lamp, a carbon arc lamp, a halogen lamp and a fluorescent lamp for copying, etc. can be used. In addition, laser beams, electron beams and X-rays, etc., can be used for exposure to light. As one skilled in the art will appreciate, the intensity and time of exposure can be determined in a conventional manner. Typically, at a higher intensity lesser times are used and at a lower intensity greater times are used. For instance, with a 2Kw high pressure mercury lamp 50 cm from the element to be exposed, exposure times typically vary from about 3 to about 60 seconds, with exposure times of 5 to 30 seconds being more conventional.

The support is then removed by stripping off, by which the photosensitive layers at non-exposed areas are removed from the substrate due to their low adhesion to the substrate and their high adhesion to adhesion the support, while the photosensitive layers (hardened polymer layers) of exposed areas remain adhered on the substrate. Thus, a positive image of the exposing original is formed on the support and a negative image is formed on the substrate (called a negative-type resist image).

On the other hand, it is possible to form a negative image on the support and a positive image on the substrate by selecting the support and the substrate so as to have a suitable adhesive strength to the photosensitive layers (called a positive type resist image).

The effect obtained by the present invention is that a pattern having good image quality and high film strength and, particularly, a resist pattern having such properties, can be obtained using a stripping development photosensitive material by dry processing. The pattern forming process of the present invention is suitably used not only for producing printed circuits but also it can be used for various purposes such as for producing lithographic printing plates or relief printing plates, for producing reliefs, for optical reproduction and photography, etc.

One very important aspect of the present invention, as earlier indicated, is to provide resist films which have sufficient strength for tenting. Assuming a through-hole of 1 mm in diameter, tenting strength is easily measured by placing a cylinder 0.7 mm in diameter vertically disposed against the hardened resist film, and thereafter increasing the weight or load on the resist film until the resist film breaks. The static stress (weight) which is required to break resist films formed in accordance with the present invention most preferably falls in the range of about 80 to about 100 g, and this strength is sufficient for the film to withstand any standard spraying conditions in etching. While it is not conventional in the art to measure the etching spray pressure, calculations indicate that the etching pressure (which is dynamic) would correspond to a static load of about 10 to about 40 g.

As will be appreciated by one skilled in the art of printed circuit manufacture, it is generally necessary to etch prior to completion of the manufacturing process to eliminate conductor (typically copper) from portions of the substrate which are not covered by the resist image so that only in portions where conductor is covered will conductive pattern remain on the substrate. In this aspect, the present invention is entirely conventional, i.e., the composition and conditions used for etching can be selected from those conventionally used in the art and can easily be determined by one skilled in the manufacture of printed circuits.

The present invention will now be illustrated by several examples. In the examples, ratios of ingredients are shown as parts by weight.

EXAMPLE 1

2.5 parts of chlorinated polyethylene (Superchlon CPE-907LTA produced by Sanyo Kokusaku Pulp Co., Ltd.; chlorine content of 69% by wt, viscosity of 90 cps in toluene (40% by wt. chlorinated polyethylene at 25° C)), 3,3 parts of pentaerythritol trimethacrylate (monomer), 0.1 part of 1-methyl-2-benzoylmethylene-$\beta$-napthothiazoline (light polymerization initiator), 0.02 part of phenothiazine (heat polymerization inhibitor) and 0.2 part of copper phthalocyanine pigment (coloring agent) were dissolved or dispersed in 5 parts of dichloroethane to produce Coating Solution 1. This Solution was applied onto a polyethylene terephthalate film (support) 25 $\mu$ thick by means of an application rod and dried at 80° C for 20 minutes to form a layer having a 15 $\mu$ dry thickness.

Coating Solution 2 having the same composition as that of Coating Solution 1 except that 1.8 parts of polymethyl methacrylate (Sumipex BLG, produced by Sumitomo Chemical Co., Ltd.; m.w. about 100,000) and 0.8 part of the above described chlorinated polyethylene were used as the binder was prepared. Coating Soltution 2 was applied in the same manner as Coating Solution 1 to the first layer (15 $\mu$ dry thickness) produced from the Coating Solution 1 as above and dried in the same manner as the first layer to form a second layer having a 15 $\mu$ dry thickness. The total dry thickness of the photosensitive layers of the resultant photosensitive material was thus 30 $\mu$.

The resultant photosensitive material was then superposed on a clean copper substrate for a printed circuit (thin copper plate on an epoxy resin base having 500 throughholes of 1.5 mm in diameter) at 25° C under pressure with the surface of the photosensitive layers contacting the substrate to form a laminate. A negative original having a pattern for a printed circuit was then laid on the support of the resultant laminate and it was exposed to light for 1 minute using a 2 KW high pressure mercury lamp at a distance of 50 cm.

The negative original having a printed circuit pattern comprised a black background with transparent lines thereon (lines in the pattern having a 0.3 to 2 mm width) and colorless circles thereon (having a 2.5 mm diameter), the colorless circles coinciding with the holes of the substrate. Accordingly, if exposure to light is carried out after the original is placed on the support so that the circular patterns coincide with the holes of the substrate, common resist patterns and resist patterns which cover all holes and around the holes will be formed on the substrate.

The support was then stripped off at 25° C, whereby a light hardened positive image was formed on the copper plate with non-exposed portions being removed from the copper substrate with the support while adhered thereto. Further, all the through-holes in the substrate were covered by a hardened film.

The substrate having a resist pattern was then etch processed for 1 to 3 minutes at 40° C using a 40 wt% ferric chloride solution by a spray etching method. Upon thus processing, the resist film did not come off except on the through-holes of the substrate. Further, the ratio of the resist film covering the holes (tented) which remained without being broken by the shock of spraying (called the tenting ratio) was 98%. Thus, out of 100 holes 98 holes were still covered by the resist film after etching spraying, whereas etchant solution reached and etched the inside-surface (copper) of two of the through-holes.

The substrate was then washed with methyl ethyl ketone for about 5 minutes at room temperature to dissolve the resist film, whereby the resist film was easily removed from the copper plate and a clear copper printed circuit pattern was formed on the epoxy resin plate.

As will be appreciated by one skilled in the art, the resist film formed in accordance with the present invention is removed using essentially conventional techniques. For instance, solvents such as dichloromethane, ethyl dichloride, methyl ethyl ketone, 1,1,1-trichloroethane and the like can be used. Commonly used conditions involve removal at room temperature by immersion for about 10 to about 300 seconds in the solvent, more commonly 30 to 60 seconds. Such operations are conventionally performed at atmospheric pressure.

EXAMPLE 2 (Comparison)

Coating Solution 1 in Example 1 was applied to a polyethylene terephthalate film (25 μ thick) by means of a coating rod and dried at 80° C for 20 minutes to form a photosensitive layer having a 30 μ dry thickness. Lamination to a copper substrate, exposure to light and stripping development were carried out in the same manner as in Example 1. The resultant resist pattern had good quality similar to Example 1, but the tenting ratio was only 10% when it was subjected to etching in the same manner as in Example 1.

In a second run, Coating Solution 2 in Example 1 was applied to a polyethylene terephthalate film (25 μ thick) and dried in the same manner as described above to form a photosensitive layer having a 30 μ dry thickness which was superposed on a copper plate to make a laminate, exposed to light and the support then removed by stripping off as in Example 1. Upon stripping, portions of the non-exposed photosensitive layer, particularly portions near the exposed areas, remained on the support together with exposed areas, and, consequently, an imperfect image was obtained. The tenting ratio after etching as in Example 1 was 90%.

EXAMPLE 3

2.5 parts of chlorinated polyethylene (the same one as in Example 1), 3.3 parts of pentaerythritol triacrylate (monomer), 0.1 parts of 2-t-butylanthraquinone (light polymerization initiator), 0.02 parts of phenothiazine and 0.2 parts of copper phthalocyanine pigment were dissolved or dispersed in 5 parts of dichloroethane to produce Coating Solution 3. Similarly, Coating Solution 4 having the same composition as Coating Solution 3 was prepared except that 2.5 parts of polymethyl methacrylate (the same one as in Example 1) were used instead of chlorinated polyethylene and 6 parts of dichloroethane were used as a solvent.

Coating solutions 3 and 4 were applied in the order of Coating Solution 3, Coating Solution 4 and Coating Solution 3 onto a polyethylene terephthalate film (thickness 25μ) by repeating coating by means of a coating rod and drying (at 80° C for 20 minutes) so as to form layers each of a 10 μ dry thickness, to thereby produce a photosensitive material having three photosensitive layers (30 μ total layer dry thickness).

The resultant photosensitive material was then superposed on a clean copper substrate at 40° C to form a laminate similar to that in Example 1. Upon exposure to light as in Example 1 and stripping development at 25° C, a resist pattern of good quality similar to that of Example 1 was formed on the copper plate. The copper plate was then subjected to etching as in Example 1. The resist film did not come off and the tenting ratio was 100%. The resist film was easily removed by immersion in methyl ethyl ketone as in Example 1.

EXAMPLE 4 (Comparison)

Coating Solution 4 in Example 3 was applied to a polyethylene terephthalate film (25 μ thick) to produce a photosensitive material having a photosensitive layer having a 30 μ dry thickness. This photosensitive material was superposed on a copper base plate at 40° C to form a laminate as in Example 3, and exposed and the support stripped off at 25° C as in Example 3. The whole photosensitive layer, namely, both exposed portions, and non-exposed portions, was transferred to the substrate and no image was formed.

EXAMPLE 5

2.5 parts of chlorinated polypropylene (Superchlon CPP-306, produced by Sanyo Kokusaku Pulp Co.; chlorine content of 71% by weight, viscosity ($\eta$) of 0.129 as a benzene solution at 30° C) 2, parts of polyester acrylate (methacrylate) monomer (Aronix M-8030, produced by Toa Gosei Chemical Industry Co.), 1 part of polyester acrylate methacrylate) monomer (Aronix M-6100, produced by Toa Gosei Chemical Industry Co.), 0.2 part of benzoin (light polymerization initiator), 0.03 part of p-methoxyphenol (heat polymerization inhibitor) and 0.1 part of carbon black (coloring agent) were dissolved or dispersed in 5 parts of methyl ethyl ketone to produce Coating Solution 5. Further, Coating Solution 6 having the same composition as Coating Solution 5 was produced except that 2.5 parts of acrylonitrile-butadiene-styrene copolymer (Litax ABS-3100, produced by Mitsui Toatsu Chemical Co.) were used as the binder instead of chlorinated polypropylene. Further, Coating Solution 7 having the same composition as Coating Solution 5 was produced except that 2.5 parts of ethyl cellulose (Etcel T-50, produced by Hercules Inc.) was used as the binder instead of chlorinated polypropylene.

Coating solutions 5, 6 and 7 were applied in this order to a polyethylene terephthalate film (thickness: 25 μ) by repeating coating by means of a coating rod and drying (at 80° C, 20 minutes) so as to form layers each having a 10 μ dry thickness to produce a photosensitive material having three photosensitive layers (30 μ total layer dry thickness).

The resultant photosensitive material was then superposed on a copper substrate at 25° C to form a laminate, image-wise exposed and then subjected to stripping development, all as in Example 1 except for stripping at 50° C, whereby a resist pattern of good quality similar to that of Example 1 was formed on the copper plate. The copper plate was then subjected to etching as in Example 1. The resist film did not come off and the tenting ratio was 100%. The resist film was easily removed by immersion in methyl ethyl ketone as in Example 1.

EXAMPLE 6

2.3 parts of polymethyl methacrylate (the same one as in Example 1), 0.2 part of chlorinated polyethylene (the same one as in Example 1), 1.5 parts of Aronix M-8030 (produced by Toa Gosei Chemical Co.), 1.5 parts of Aronix M-6300 (produced by Toa Gosei Chemical Co.), 0.2 part of benzil (light polymerization initiator), 0.03 part of p-methoxyphenol and 0.2 part of carbon black were dissolved and dispersed in 6 parts of methyl ethyl ketone to produce Coating Solution 8. Further, 2 parts of vinylidene chloride-acrylonitrile copolymer (Saran F-220, produced by Asahi Dow Ltd.; containing about 15 mol% acrylonitrile), 1.5 parts of Aronix M-8030, 1.5 parts of Aronix M-6300, 0.2 part of benzil and 0.03 part of p-methoxyphenol were dissolved and dispersed in 7 parts of methyl ethyl ketone to produce Coating Solution 9.

Coating solutions 8 and 9 were applied in this order to a triacetyl cellulose film (30 μ thick) by repeating coating and drying (80° C, 20 minutes) so as to form layers having each a 15 μ dry thickness to produce a photosensitive material having two photosensitive layers of a 30 μ total dry thickness.

This photosensitive material was superposed on a copper substrate as in Example 1(except for using a temperature of 40° C)to form a laminate which was exposed to light and subjected to stripping development, both as in Example 1 except for stripping at 50° C. A resist pattern of good quality similar to that of Example 1 was formed. After etching as in Example 1, the resist pattern did not come off and the tenting ratio was 100%. The resist film was easily removed by immersion in methyl ethyl ketone as in Example 1.

EXAMPLE 7

A polyethylene film (20 μ thick) as a protective layer was adhered to the photosensitive layer of the photosensitive material produced in Example 1. It was stored in the dark for 1 month. The protective film was then stripped off, and the photosensitive material superposed on a copper substrate in the same manner as in Example 1 to form a laminate. Upon exposure and stripping development as in Example 1, a pattern having good quality similar to that of Example 1 was obtained. After etching, the resist film did not come off and the tenting ratio was 97%.

EXAMPLE 8

The same coating solution as Coating Solution 8 in Example 6 was produced. On the other hand, Coating Solution 10 having the same composition as Coating Solution 8 in Example 6 was produced except that 2 parts of a copolymer composed of vinyl chloride as a major ingredient (Denkavinyl 1000G, produced by Electro Chemical Industry Co.) were used as the binder.

Coating solutions 8 and 10 were then applied in this order to a polyethylene terephthalate film (25 μ thick) by repeating coating and drying (80° C, 20 minutes) so as to form layers each having a 10 μ dry thickness, whereby a photosensitive material having photosensitive layers of a 20 μ total dry thickness was obtained.

The photosensitive layers of this photosensitive material were then superposed on a silicate processed aluminum plate for lithography (at 25° C) with pressure to form a laminate, and then image-wise exposed to light through a negative original on the support for 30 seconds at a distance of 50 cm using a 2 KW high pressure mercury lamp. The support was then stripped off at 25° C, whereby a light hardened positive pattern was formed on the aluminium plate while non-exposed areas of the photosensitive material were removed from the aluminium substrate together with the support (adhered thereto).

Using the resultant printing plate, offset printing was carried out with using an oil soluble ink. When 30,000 sheets of paper were printed, there was no omission or missing type, and good prints were still obtained.

EXAMPLE 9

5 parts of polyvinyl butyral (Eslec BLS, produced by Sekisui Chemical Co., Ltd.), 3 parts of pentaerythritol triacrylate, 0.1 part of 9,10-phenanthrenequinone, 0.02 part of p-methoxyphenol and 0.2 part of copper phthalocyanine pigment were dissolved or dispersed in 15 parts of dichloroethane to produce Coating Solution 11, which was applied to a polyethylene terephthalate film (25 μ thickness) and dried at 80° C for 20 minutes to form a layer having a 25 μ dry thickness. On the other hand, Coating Solution 12 having the same composition as Coating Solution 11 was produced except that 3 parts of polymethyl methacrylate (Sumipex, produced by Sumitomo Chemical Co.) and 1 part of the above described polyvinyl butyral were used as the binder. This coating solution was applied to the first layer formed of Coating Solution 11 and dried at 80° C for 20 minutes to produce a photosensitive material having photosensitive layers of a 30 μ total dry thickness. This photosensitive material was superposed on an aluminium substrate for lithography in the same manner as in Example 8, and, after exposure to light through a positive original having a type pattern, the support was stripped off, whereby a positive image composed of the non-hardened photosensitive layers was formed on the aluminium substrate and a negative image composed of light hardened photosensitive layers was formed on the support. The pattern formed on the aluminium plate was the same as the pattern formed using a negative original in Example 8.

While the invention has been described in detail and with reference to specific embodiments thereof, it will be apparent to one skilled in the art that various changes and modifications can be made therein departing from the spirit and scope thereof.

What is claimed is:

1. An image forming process which comprises image-wise exposing a photosensitive material to light, the photosensitive material comprising a support and a substrate with a photopolymerizable material therebetween, where either or both of the support or substrate is transparent and image-wise exposing is through the transparent support and/or substrate, and stripping off the support to leave either exposed areas or non-exposed areas of the photopolymerizable material on the substrate, in which the photopolymerizable material is characterized by comprising at least two different photopolymerizable layers which each comprise one or more addition polymerizable monomers, one or more photopolymerization initiators and one or more binders, which photopolymerizable layers are placed adjacent the transparent support and the substrate, wherein at least one of the ingredients or the ratio of the ingredients of the photopolymerizable layers is different in at least the two different photopolymerizable layers, and the photopolymerizable layers have the relationship of C>A>B and C'>B'>A' or C>B>A and C'>A'>B', wherein:

A is the adhesive strength between the support and the photopolymerizable layer adjacent thereto;

B is the adhesive strength between the substrate and the photopolymerizable layer adjacent thereto;

C is the lowest adhesive strength of all the adhesive strengths between any two photopolymerizable layers among the layers, A' is the adhesive strength between the support and the photopolymerizable layer adjacent thereto after exposure to light, B' is the adhesive strength between the substrate and the photopolymerizable layer adjacent thereto after exposure to light, and C' is the lowest adhesive strength of all the adhesive strengths between any two photopolymerizable layers among the photopolymerizable layers after exposure to light, whereby following image-wise exposure and delamination cohesive failure occurs either (i) at the interface of the support and the photopolymerizable layer adjacent thereto or (ii) at the interface of the substrate and the photopolymerizable layer adjacent thereto, thereby providing negative and positive images in complimentary relationship in accordance with the following:

1. In the case of cohesive failure as described at (i), the substrate carrying the layer of the photopolymerizable composition adjacent thereto and areas of the photopolymerizable composition originally on the support in correspondence to the image-wise exposure, with the support carrying a complementary image of the photopolymerizable composition originally on the support; or 2. In the case of cohesive failure as described at (ii), the support carrying the layer of the photopolymerizable composition adjacent thereto and areas of the photopolymerizable composition originally on the substrate in correspondence to the image-wise exposure, with the substrate carrying a complementary image of the photopolymerizable composition originally on the substrate.

2. The process of claim 1, wherein said substrate is a printed circuit substrate.

3. The process of claim 2, wherein substrate has through-holes.

4. The process of claim 2, wherein exposed areas remain on the substrate and unexposed areas are removed together with the support from the substrate.

5. The process of claim 2, wherein said substrate comprises a copper-plastic laminate.

6. The process of claim 2, wherein said substrate comprises a flexible film.

7. The process of claim 1, wherein a photopolymerizable layer adjacent the substrate or adjacent the support comprises a chlorinated polyolefin.

8. The process of claim 7, wherein the chlorinated polyolefin comprises at least 30 weight % of the total binder in that layer.

9. The process of claim 8, wherein the chlorinated polyolefin comprises at least 50 weight % of the total binder in that layer.

10. The process of claim 8, wherein one photopolymerizable layer is adjacent the support and wherein one photopolymerizable layer is adjacent the substrate and further wherein at least one additional photopolymerizable layer is intermediate said first two recited layers, which intermediate layer has a molecular weight of more than about 10,000 but less than about 5,000,000.

11. The process of claim 10, wherein the molecular weight of said intermediate layer is from 100,000 to 2,000,000.

12. The process of claim 10, wherein the one or more addition polymerizable monomers are selected from the group consisting of acrylates or methacrylates of polyhydric compounds, a polyester acrylate or a polyester methacrylate.

13. The process of claim 12, wherein the support is polyethylene terephthalate.

14. The process of claim 12, wherein the one or more photopolymerization initiators include at least one compound represented by the following formula:

wherein $R_1$ is an alkyl group and $R_2$ is an alkyl group or an aryl group.

15. The process of claim 12, wherein the one or more photopolymerization initiators include at least one compound represented by the following formula:

wherein $R^3$ and $R^4$ are alkyl groups of 1 to 5 carbon atoms.

16. The process of claim 1, wherein said support is transparent and said substrate is metal, image-wise exposure being through said transparent support.

17. The process of claim 1, wherein said photosensitive material comprises a support and a substrate with a photopolymerizable material therebetween which comprises at least three sublayers, the sublayers which are adjacent to the support and the substrate, respectively, contribute to providing images of good quality by sharply breaking at the interface between exposed and unexposed areas upon stripping development, and any remaining layers intermediate these two sublayers not contributing directly to image quality, but primarily contributing to provide a resist film after image-wise exposure and stripping development which has high mechanical strength.

18. The process of claim 1, wherein said photosensitive material comprises a support, a substrate and a photopolymerizable material therebetween, said photopolymerizable material comprising at least one sublayer which is adjacent the support and one sublayer which is adjacent the substrate which forms sharp images which do not form a tenting film resistant to etching processing, and at least one sublayer having high film strength therebetween, high film strength being defined as follows:

after image-wise exposure to cause photopolymerization, the strength of the layer is sufficient to resist the preseure of etchant during etching spraying.

19. The process of claim 1, wherein said photosensitive material comprises a support and a substrate with a photopolymerizable material therebetween, said photopolymerizable material comprising sublayers adjacent the support and the substrate, respectively, which sublayers are easily separated at the boundary between exposed and unexposed portions thereof resulting from image-wise exposure by stripping development, and comprising a binder selected from the group consisting of chlorinated polyethylene, chlorinated polypropolene, chlorinated rubbers, and polymers comprising more than 50 mol % of vinylidene chloride.

20. The process of claim 19, wherein said binders have a molecular weight in the range of about 5,000 to about 100,000.

21. The process of claim 20, wherein a layer comprising these polymers is adjacent the transparent support.

22. The process of claim 1, wherein said photosensitive material comprises a support and a substrate with a photopolymerizable material therebetween, the photopolymerizable material comprising at least two sublayers one adjacent to the support and one adjacent to the substrate, each of said sublayers comprising a polymer binder wherein:

i. the identity of the monomeric components of the polymer binder of the sublayers differs; or ii. the monomeric components of the polymer binders in each sublayer are identical but the ratio between the monomeric components of the polymer binder in each sublayer differs; or iii. the molecular weight of the polymer binder in each sublayer differs.

23. The process of claim 1, wherein the photosensitive material comprises a support and a substrate with a photopolymerizable material therebetween, the photopolymerizable material comprising at least two different sublayers adjacent the support and the substrate which comprise at least one polymeric binder and at least one monomer, which binder-monomer combination upon image-wise exposure reverses its adhesion gradient between exposed and unexposed areas.

24. The process of claim 20, wherein there is present at least one layer intermediate the two sublayers, which layer comprises a polymer binder having a molecular weight in the range of about 10,000 to about 5,000,000, which polymer binder provides high strength to said layer.

25. The process of claim 1, wherein the ratio by weight of the one or more binders to the monomer is in the range of about 2 to about 0.2, per 100 parts by weight of the one or more binders present in the layer involved.

* * * * *